United States Patent
Tsai et al.

(10) Patent No.: US 7,675,437 B2
(45) Date of Patent: Mar. 9, 2010

(54) VARIABLE LENGTH DECODING DEVICE AND METHOD FOR IMPROVING VARIABLE LENGTH DECODING PERFORMANCE

(75) Inventors: Cheng-Ming Tsai, Taipei (TW); Shih-Hao Huang, Taipei (TW); Chang-Lin Lu, Taipei (TW)

(73) Assignee: Via Technologies, Inc., Taipei (TW)

( * ) Notice: Subject to any disclaimer, the term of this patent is extended or adjusted under 35 U.S.C. 154(b) by 86 days.

(21) Appl. No.: 12/049,413

(22) Filed: Mar. 17, 2008

(65) Prior Publication Data

US 2008/0231481 A1  Sep. 25, 2008

(30) Foreign Application Priority Data

Mar. 21, 2007  (TW) .............. 96109716 A

(51) Int. Cl.
*H03M 7/40* (2006.01)
(52) U.S. Cl. ......................... 341/67; 341/107
(58) Field of Classification Search ............... 341/50, 341/51, 67, 107; 382/246, 307; 375/240.03
See application file for complete search history.

(56) References Cited

U.S. PATENT DOCUMENTS 5,844,611 A * 12/1998 Hamano et al. .......... 375/240.2
5,940,017 A * 8/1999 Jeon ........................... 341/67
5,963,260 A * 10/1999 Bakhmutsky ........... 375/240.24
6,011,498 A * 1/2000 Wittig ........................ 341/67

\* cited by examiner

*Primary Examiner*—Brian Young
(74) *Attorney, Agent, or Firm*—Thomas, Kayden, Horstemeyer & Risley

(57) ABSTRACT

A method for improving variable length decoding performance is provided. A variable length decoding module decodes a coded data to obtain a decoded data and a subsequent module receives the decoded data to perform further processing. A buffering module is coupled between the variable length decoding module and the subsequent module, and buffers the decoded data decoded by the variable length decoding module. A read part of the buffering module is cleared so that a content of an unused area of the buffering module is a predetermined value when the subsequent module reads the decoded data from the buffering module, wherein the unused area is a part of the buffering module except for the unread decoded data. The variable length decoding module does not write zero values of the decoded data into the buffering module when the variable length decoding module reads a zero output instruction among the coded data.

18 Claims, 17 Drawing Sheets

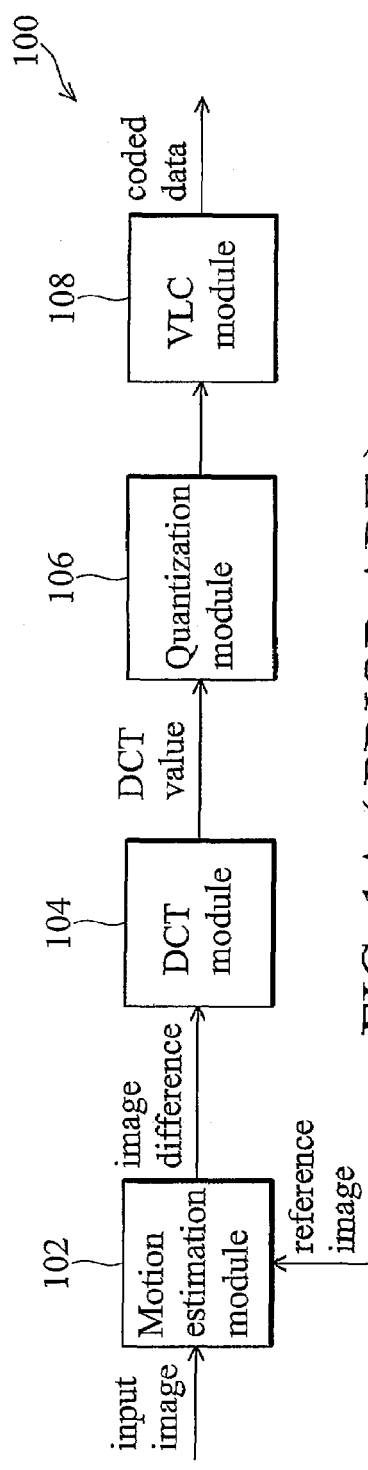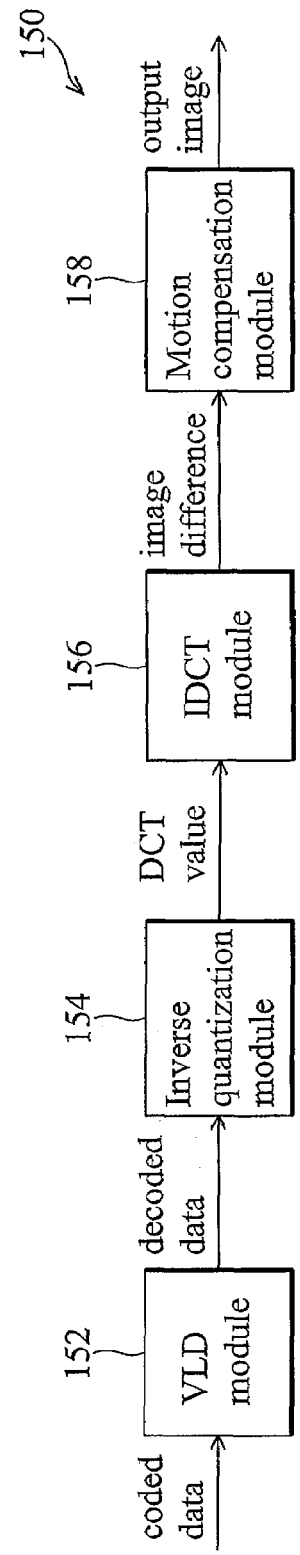
FIG. 1A (PRIOR ART)
FIG. 1B (PRIOR ART)

| clock | 0 | 1 | 2 | 3 | 4 | 5 | ..... |
|---|---|---|---|---|---|---|---|
| run value | 0 | 0 | 3 | 0 | 0 | 2 | ..... |
| level value | 15 | 13 | 12 | 8 | 3 | 7 | ..... |
| memory address | 0 | 1 | 5 | 6 | 7 | 10 | ..... |

| DCT value | 15 | 13 | 0 | 0 | 0 | 12 | 8 | 3 | 0 | 0 | 7 | ..... |
|---|---|---|---|---|---|---|---|---|---|---|---|---|

FIG. 6

VARIABLE LENGTH DECODING DEVICE AND METHOD FOR IMPROVING VARIABLE LENGTH DECODING PERFORMANCE

BACKGROUND OF THE INVENTION

1. Field of the Invention

The invention relates to video or audio decoding, and more particularly to a variable length decoding (VLD).

2. Description of the Related Art

Variable length coding (VLC) is a multimedia file coding technique, which can reduce a great quantity of coded data, so that a data transmission bandwidth or a storing space will also be reduced. VLC is widely applied in various video or audio coding formats, such as motion picture experts group (MPEG) coding. Moreover, the coded data is decoded through VLD to be recovered as an original code when the coded data is playing.

FIG. 1A shows a block diagram of an MPEG coder 100. The MPEG coder 100 comprises a motion estimation module 102, a discrete cosine transformation (DCT) module 104, a quantization module 106 and a VLC module 108. First, the motion estimation module 102 compares an input image and a reference image to obtain an image difference. Next, the DCT module 104 transforms the image difference into a DCT value. After the DCT value is quantized by the quantization module 106, a VLC operation is performing by the VLC module 108 to obtain a coded data.

FIG. 1B shows a block diagram of an MPEG decoder 150. The MPEG decoder 150 comprises a VLD module 152, an inverse quantization module 154, an inverse discrete cosine transformation (IDCT) module 156 and a motion compensation module 158. First, the VLD module 152 decodes the coded data to a decoded data through a VLD operation, and then the decoded data is inverse-quantized to the DCT value by the inverse quantization module 154. Next, the IDCT module 156 transforms and recovers the DCT value to the image difference. Finally, the motion compensation module 158 compensates an image by the image difference to obtain an output image.

However, the VLD module 152 shown in FIG. 1B requires much time to output a serial of zero values as the decoded data during decoding. Statistically, the serial of zero values will account for 70%-98% of the decoded data output from the VLD module 152.

The serial of zero values are output at least during the following statuses: 1) when an end of block (EOB) data is read; 2) when a coded block pattern (CPB) bit is zero; 3) when a skipped macro block data is read; and 4) when a run-level pair of the coded data is decoded. FIG. 2A shows a data block 200 with an EOB code 202. The decoded data decoded by the VLD module 152 comprises 8×8 (64) data which are composed of a serial of data blocks.

In the data block 200 of the decoded data output from the VLD module 152, the data values (shown as label 204) appearing after a pixel 202 are zero, wherein a value of the pixel 202 is 5, when the VLD module 152 reads an EOB code from a received coded data, such as the pixel 202 shown in FIG. 2A, which is interpreted as 5, and then a 2 bit EOB code "10" is met. The EOB code is not shown in FIG. 2A due to the fact that an EOB code only exists in the coded data and can not be decoded.

Furthermore, each macro block is composed of six data blocks among the decoded data. The macro block comprises four Y data blocks and Cb and Cr data blocks sampled from the four Y data blocks, wherein the four Y data blocks are shown as label 212 in FIG. 2B. The coded data read by the VLD module 152 comprises a CBP bit for indication of the data blocks which values are zero within a macro block. Thus, the VLD module 152 will output a data block which has zero values when the VLD module 152 reads that a CBP bit of a data block 214 of the coded data is zero. In addition, the skipped macro block data represents that all values of six data blocks composing a macro block are zero, shown as six data blocks 223-228 of a macro block 222 in FIG. 2C. Therefore, total capacity of six data blocks are output as zero values when the CBP bit is read by the VLD module 152.

FIG. 2D shows a process wherein a data block 232 is coded as a serial of run-level pairs through a VLC technique. A run-level pair comprises a run value and a level value. For example, the data block 232 comprises a serial data "1005000008", wherein 8 is a last level value. The serial data is coded as 1, (2, 5) and (5, 8), wherein (2, 5) and (5, 8) are run-level pairs. Thus, the VLD module 152 will output a lot of zero values according to the run value of each run-level pair when the run-level pair of the coded data is decoded.

If continuous zero values are output, a decoding time will be delayed and total decoding performance of the MPEG decoder 150 will be reduced. Thus, by improving the above disadvantages VLD efficiency can be enhanced and performance of video and audio decoding can be substantially increased.

BRIEF SUMMARY OF THE INVENTION

A method for improving variable length decoding performance and a variable length decoding device are provided. An exemplary embodiment of such a method for improving variable length decoding performance is applied so that a variable length decoding module decodes a coded data to obtain a decoded data and a subsequent module receives the decoded data to perform further processing. The method comprises: coupling a buffering module between the variable length decoding module and the subsequent module, and buffering the decoded data decoded by the variable length decoding module; and clearing a read part of the buffering module so that a content of an unused area of the buffering module is a predetermined value when the subsequent module reads the decoded data from the buffering module, wherein the unused area is a part of the buffering module except for the unread decoded data. The variable length decoding module does not write zero values of the decoded data into the buffering module when the variable length decoding module reads a zero output instruction among the coded data.

Furthermore, an exemplary embodiment of a variable length decoding device comprises a variable length decoding module, a subsequent module and a buffering module coupled between the variable length decoding module and the subsequent module. The variable length decoding module decodes a coded data coded by a variable length coding technique to obtain a decoded data. The buffering module buffers the decoded data from the variable length decoding module, and clears a read part so that a content of an unused area of the buffering module is a predetermined value when the subsequent module reads the decoded data from the buffering module to perform further processing, wherein the unused area is a part of the buffering module except for the unread decoded data, wherein the variable length decoding module does not write zero values of the decoded data into the buffering module when the variable length decoding module reads a zero output instruction among the coded data.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein:

FIG. 1A shows a block diagram of an MPEG coder;

FIG. 1B shows a block diagram of an MPEG decoder;

FIG. 6 shows a VLD module decoding a run-level pair as a decoded data; and

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 3A:
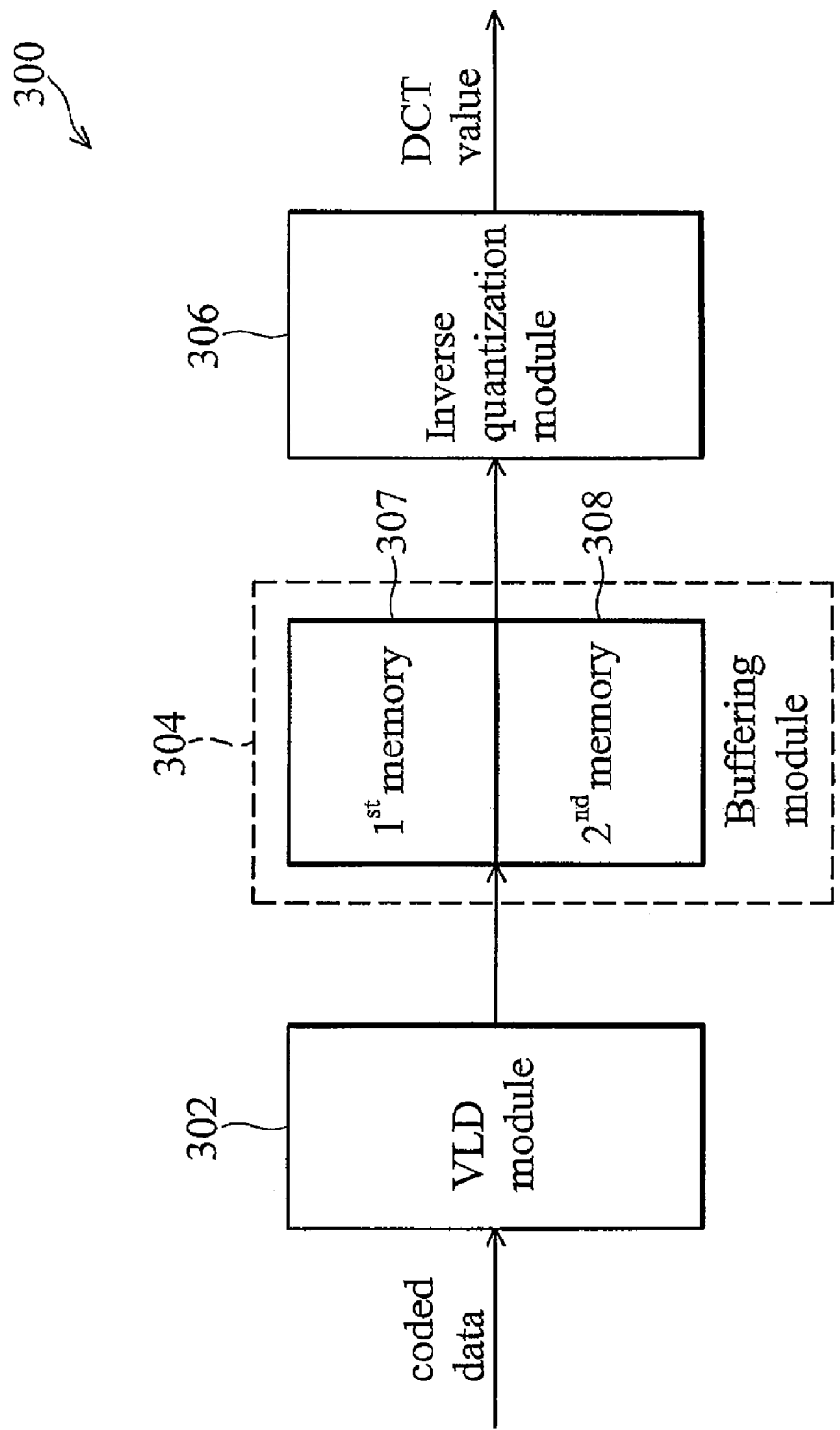
FIG. 3A shows a block diagram of a decoding device according to an embodiment of the invention.

FIG. 3A shows a block diagram of a decoding device 300 according to an embodiment of the invention. The decoding device 300 comprises a variable length decoding (VLD) module 302, a buffering module 304 and an inverse quantization module 306. The VLD module 302 decodes a coded data to obtain a decoded data, wherein the coded data is coded by a variable length coding (VLC) technique. The decoded data from the VLD module 302 is buffered by the buffering module 304. The inverse quantization module 306 reads the decoded data from the buffering module 304 to perform further processing. If the inverse quantization module 306 reads the decoded data from the buffering module 304, a read part within the buffering module 304 is immediately cleared and the buffering module 304 clears the read part as a predetermined value, which is zero value in a preferred status. Hence, an area of the buffering module 304, which does not store the decoded data, may hold its content in a clear status of the predetermined value for a successive decoded data written by the VLD module 302.

Figure 3B:
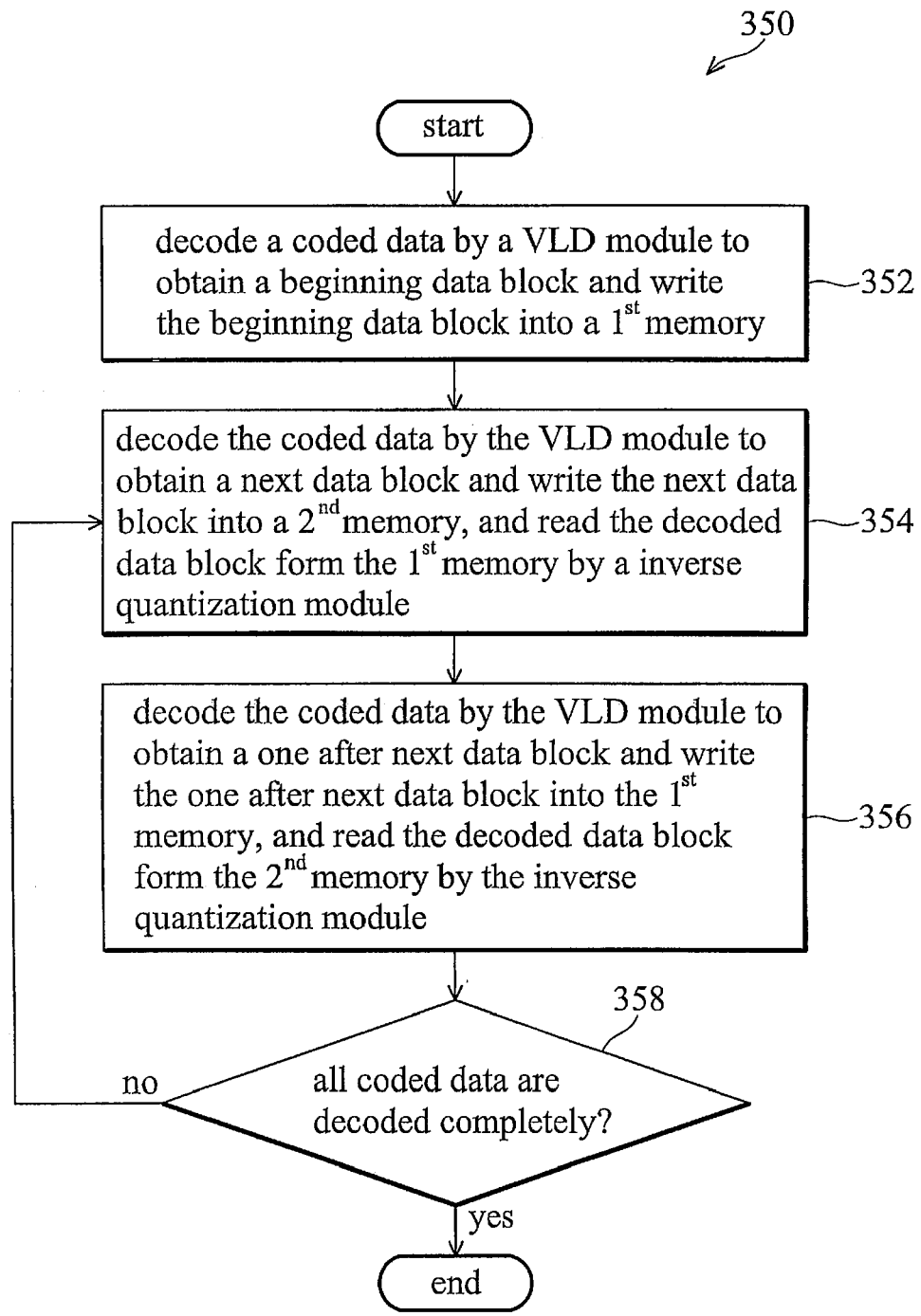
FIG. 3B shows a writing and reading flow chart according to the buffering module of the invention.

The buffering module 304 comprises a first memory 307 and a second memory 308. Each capacity of the first memory 307 and the second memory 308 is exactly sufficient to store a data block of the decoded data, i.e. 64 discrete cosine transformation (DCT) values. Each capacity of the first memory 307 and the second memory 308 is 64×12 bits when the DCT value includes 12 bits. The VLD module 302 writes a plurality of data blocks of the decoded data into the first memory 307 and the second memory 308 in an interchange sequence. FIG. 3B shows a writing and reading flow chart of the buffering module 304 according to the invention. First, in step 352, the VLD module 302 decodes the coded data to obtain a beginning data block, and writes the beginning data block into the first memory 307. Next, in step 354, the VLD module 302 continues decoding the coded data to obtain a next data block, and writes the next data block into the second memory 308. In the meantime, the inverse quantization module 306 reads the data block stored in the first memory 307 in step 354. Next, in step 356, the VLD module 302 continues decoding the coded data to obtain a one after next data block, and writes the one after next data block into the first memory 307. At the same time, the inverse quantization module 306 reads the decoded data block from the second memory 308 in step 356. Steps 354 and 356 are performed continuously, until all coded data are decoded completely in step 358, otherwise the first memory 307 is simultaneously read when the second memory 308 is written, and the second memory 308 is simultaneously read when the first memory 307 is written.

Figure 4A:
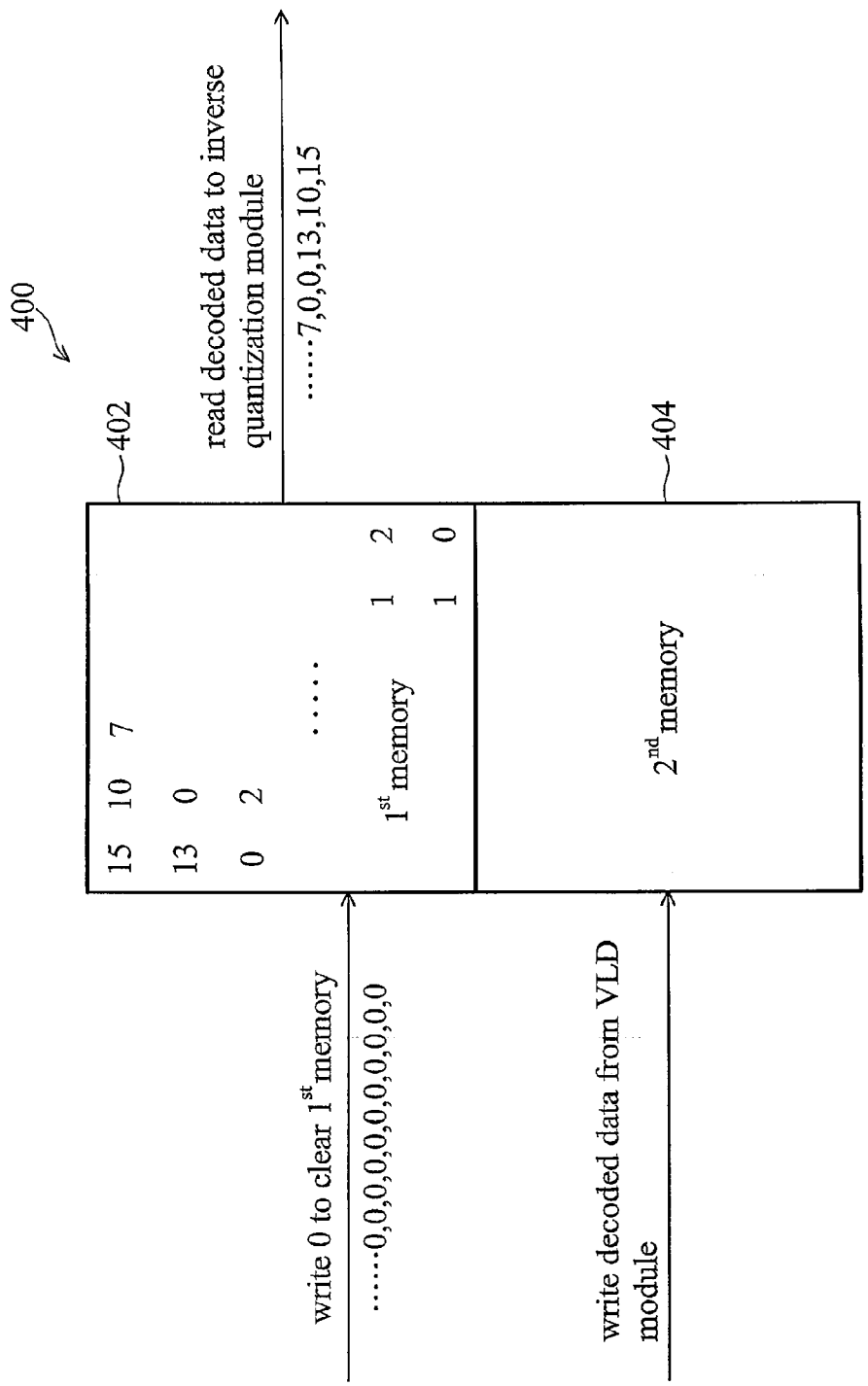
FIG. 4A shows a diagram of a buffering module performing an automatic clearing process according to the invention.

FIG. 4A shows a diagram of a buffering module 400 performing an automatic clearing process according to the invention. The buffering module 400 comprises a first memory 402 and a second memory 404. As shown in step 354 of FIG. 3B, the inverse quantization module reads a last data block from the first memory 402 when the VLD module writes a data block into the second memory 404. If the inverse quantization module reads a position of the last data block from the first memory 402, the buffering module 400 will automatically and immediately clear the read position of the first memory 402 as the predetermined value. Similarly, if the inverse quantization module reads a position of the data block from the second memory 404, the buffering module 400 will also automatically and immediately clear the read position of the second memory 404 as the predetermined value. In order to perform reading and writing in a memory simultaneously, both the first memory 402 and the second memory 404 are two-port memories.

Figure 4B:
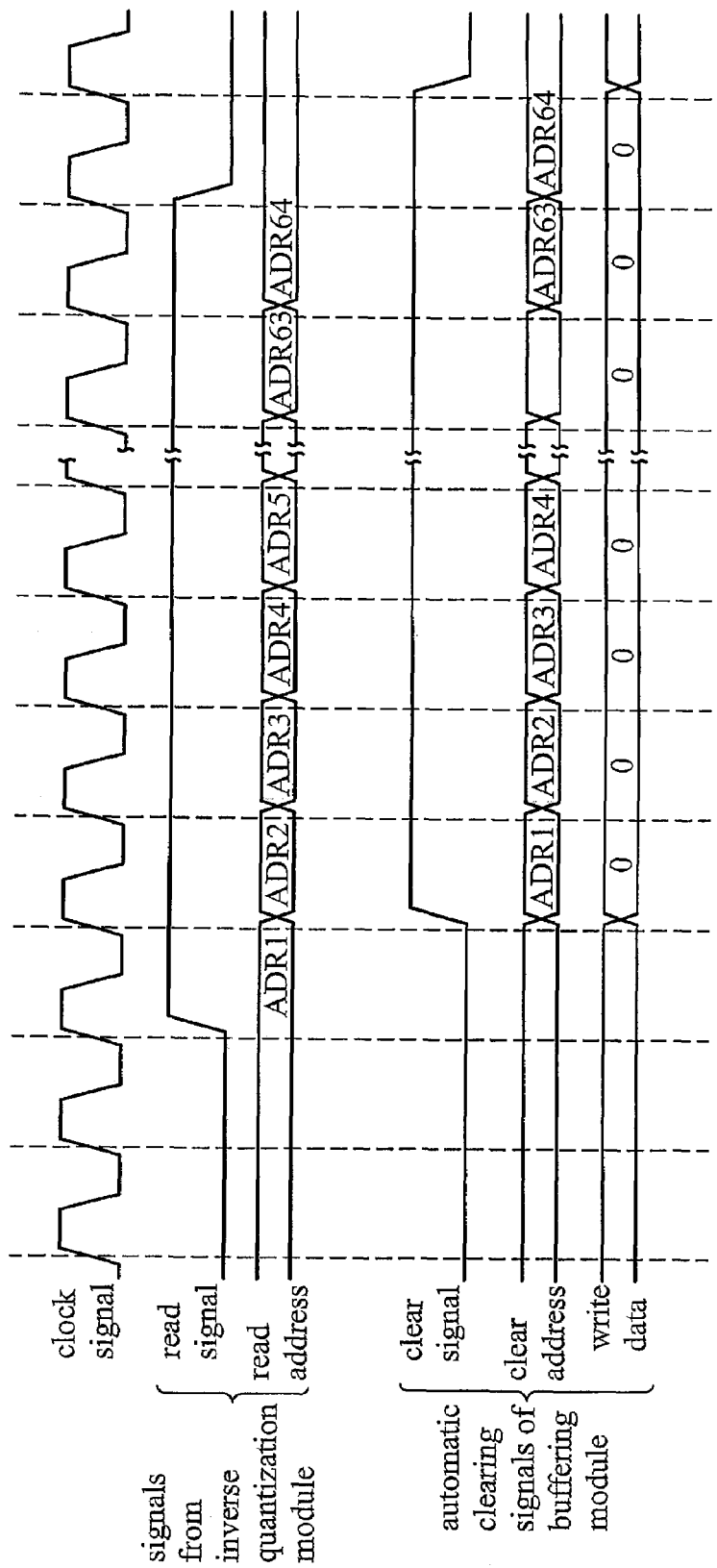
FIG. 4B shows a timing diagram of signals in the buffering module performing the automatic clearing process.

FIG. 4B shows a timing diagram of signals in the buffering module 400 performing the automatic clearing process. Using FIG. 4A as an example, the inverse quantization module outputs a read signal to start a reading process of the first memory 402, and outputs a read address to assign a data which is required to be read. The read signal and the read address are delayed to generate a clear signal for starting a writing zero process of the first memory 402 and a clear address for assigning the data which is required to be read, respectively, wherein the clear signal and the clear address are sent to the first memory 402 to perform the automatic clearing process.

Figure 4C:
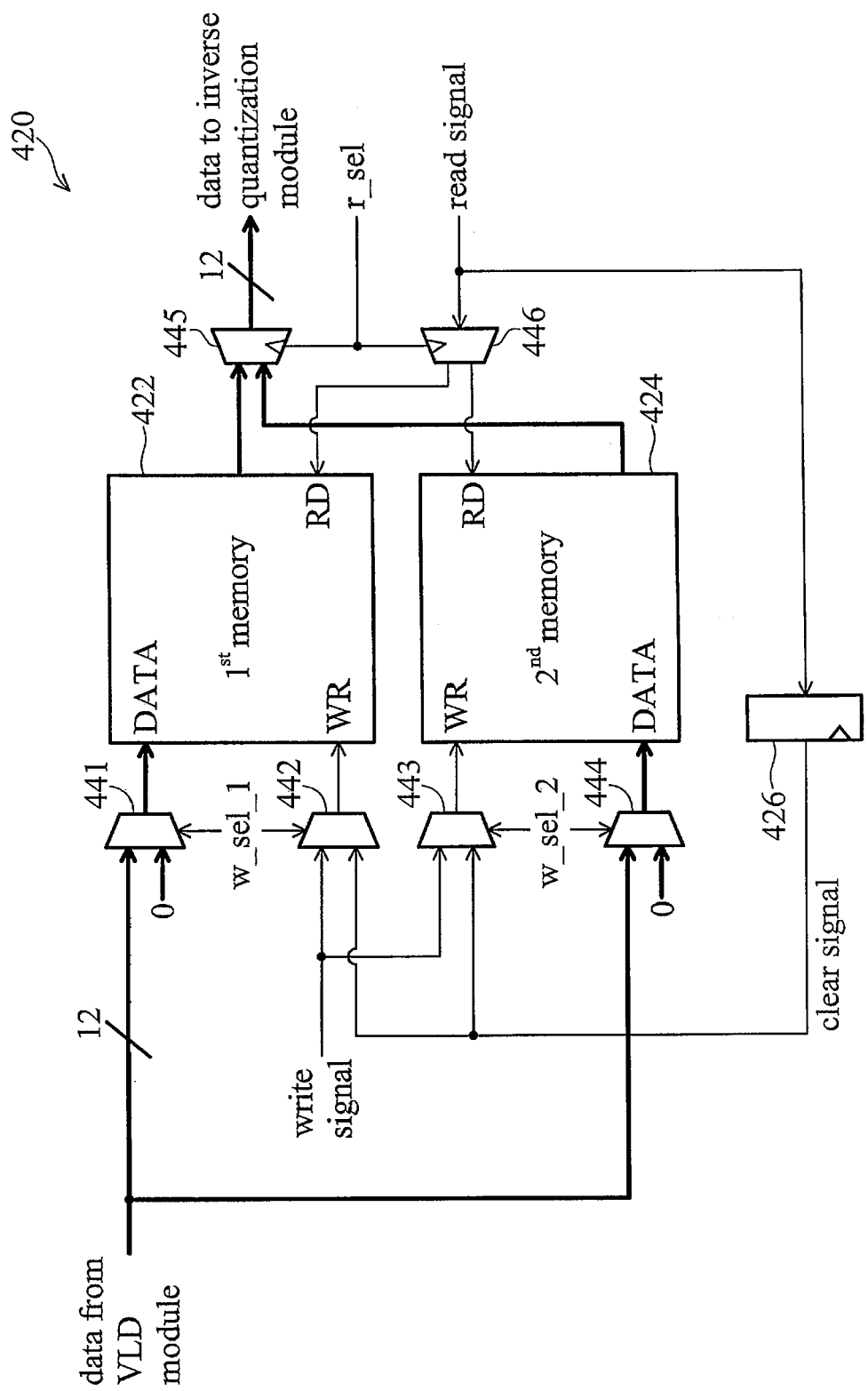
FIG. 4C shows a circuit for delaying a read signal to generate a clear signal.
Figure 4D:
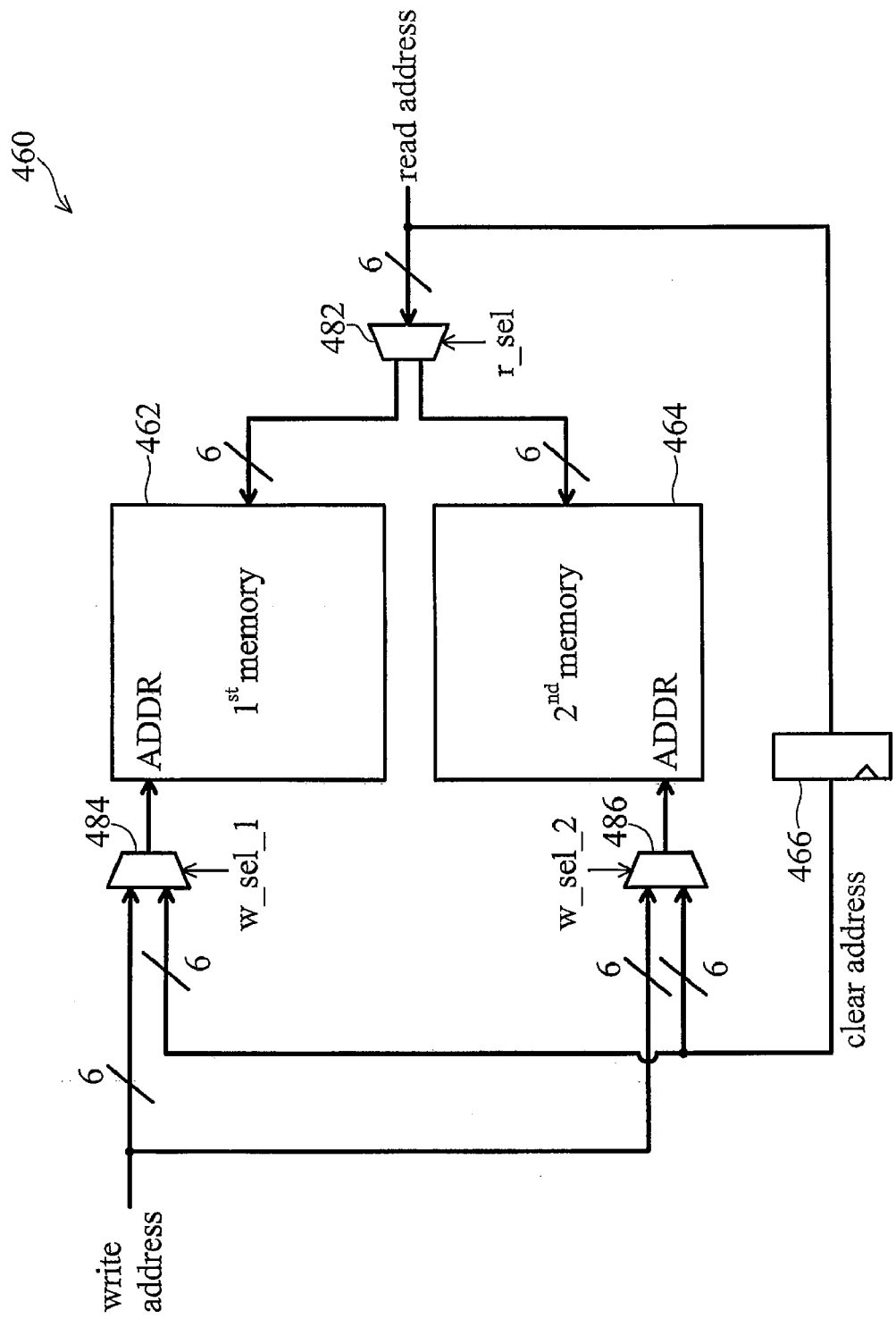
FIG. 4D shows a circuit for delaying a read address to generate a clear address.

FIG. 4C shows a circuit for delaying a read signal to generate a clear signal, and FIG. 4D shows a circuit for delaying a read address to generate a clear address. The delay modules 426 and 466 receive the read signal and the read address from the inverse quantization module to generate the clear signal and the clear address, respectively, wherein the clear signal and the clear address are sent to the first or the second memories. Specifically, if the inverse quantization module selects the first or second memories according to the read signal shown in FIG. 4C and assigns a read position of the first or second memories according to the read address shown in FIG.

4D, the first or second memories selected by the read signal will output a data located in the read address. After reading is completed, the data of the memory is cleared, thus memory space can be used repetitiously. At this time, the clear signal is generated by the delayed read signal shown in FIG. 4C to select a write terminal of the first or second memories, and the delayed read address shown in FIG. 4D is used to assign a write address of the first or second memories. Thus, zero values are written into an original read address of the first or second memories to clear the data which has been read. In FIG. 4C, although zero values are used to be written into the first or second memories, the values are not limited. Other predetermined values may be used to write into the original read address of the first or second memories to indicate that a content of the original read address is cleared and the then the decoded module can write a succeeding data into the memories.

Figure 5A:
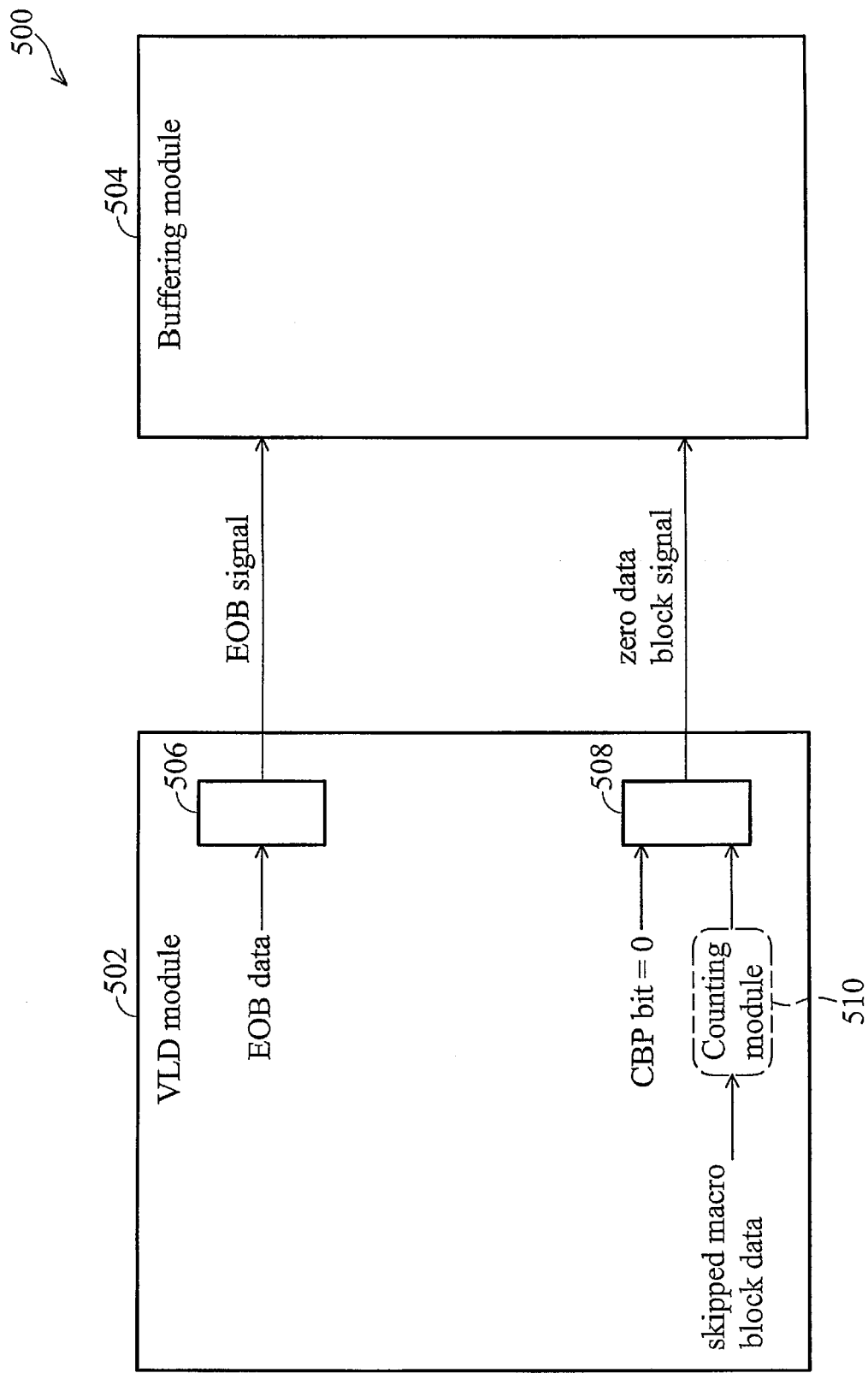
FIG. 5A shows a block diagram of a decoding device according to an embodiment of the invention.
Figure 5B:
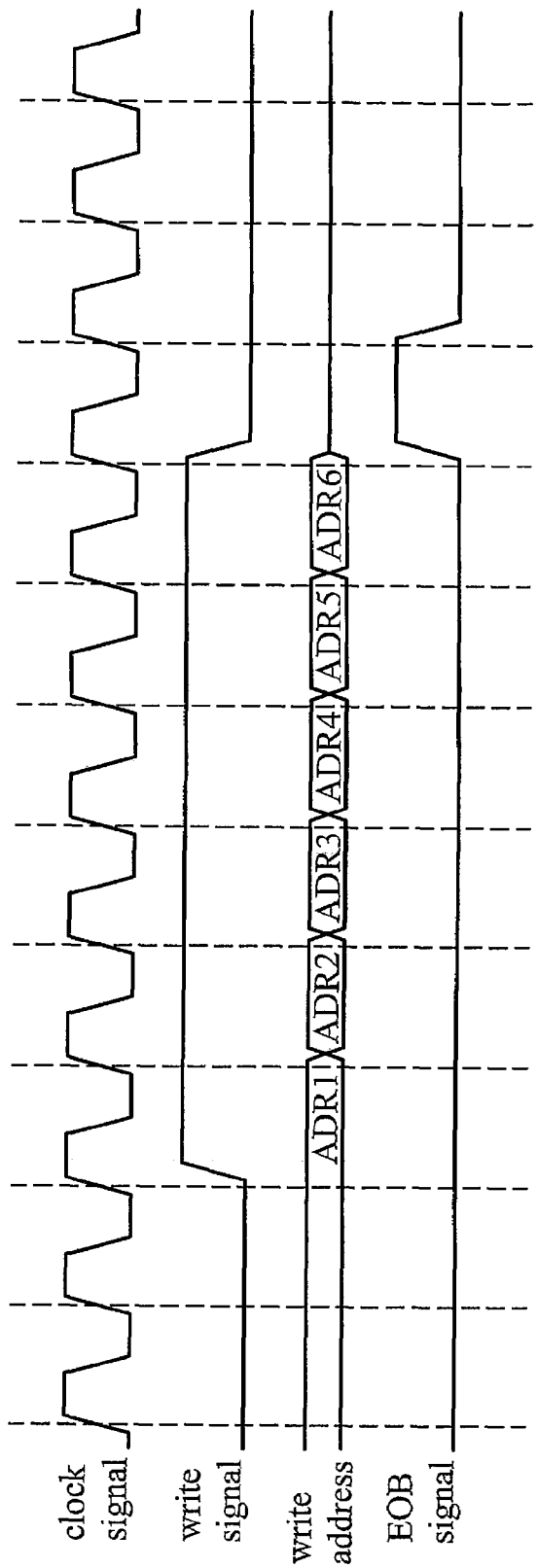
FIG. 5B shows a timing diagram of the EOB signal.

In order to solve the problem of conventional VLD modules outputting zero values continuously, the invention integrates the above automatic clearing process of the buffering module to reduce a filling zero process time in a VLD module. FIG. 5A shows a block diagram of a decoding device 500 according to an embodiment of the invention. The decoding device 500 comprises a VLD module 502 and a buffering module 504. If the VLD module 502 receives a coded data and decodes the coded data to obtain an end of block (EOB) data, the VLD module 502 may bypass a remaining data among the same data block and not to write zero values into the buffering module 504 repeatedly due to a data storage area of the buffering module 504 being cleared as zero in advance. The VLD module 502 sends an EOB signal to the buffering module 504 when the EOB data is read. FIG. 5B shows a timing diagram of the EOB signal.

Figure 5C:
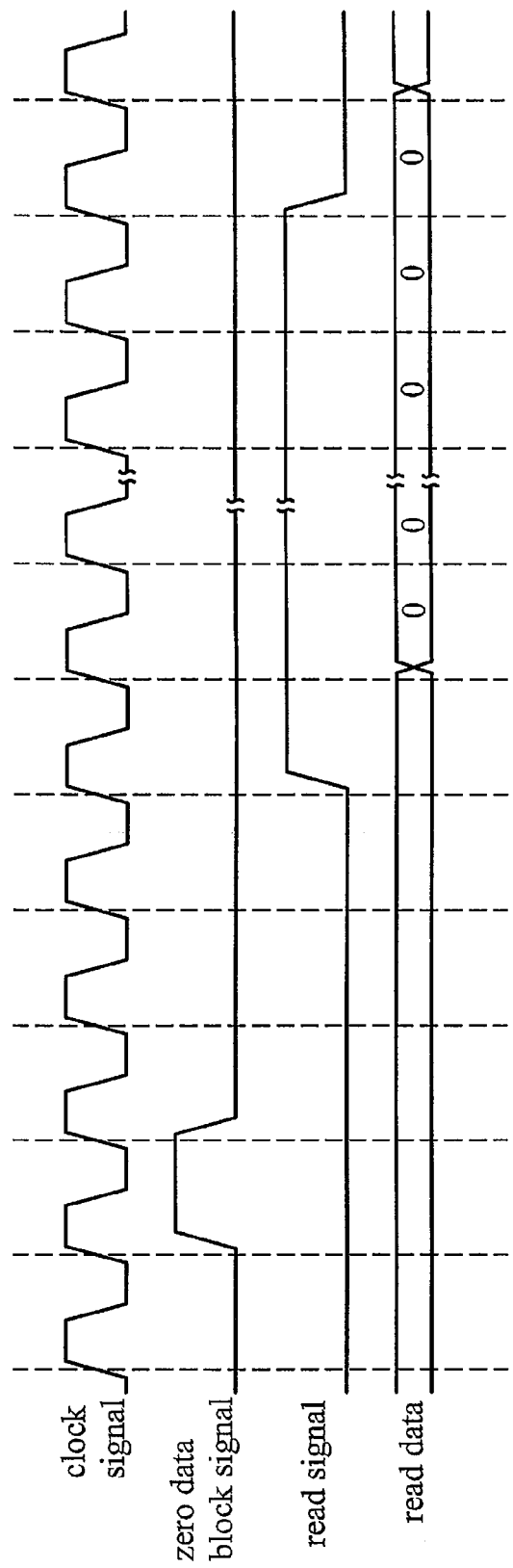
FIG. 5C shows a timing diagram of the zero data block signal.

Furthermore, the VLD module 502 sends a zero data block signal to the buffering module 504 when the VLD module 502 reads that a coded block pattern (CBP) bit of the coded data is zero. FIG. 5C shows a timing diagram of the zero data block signal. If the buffering module 504 receives the zero data block signal, the inverse quantization module reads a corresponding decoded data block and the buffering module 504 outputs a data block which values are zero to the inverse quantization module. For example, the buffering module 504 outputs 64 sets of zero values as a corresponding decoded data when one block comprises 64 data value. Therefore, the VLD module 502 saves 63 (64−1) clock cycles of sending the zero data block signal to perform other decoding processes.

Figure 2A:
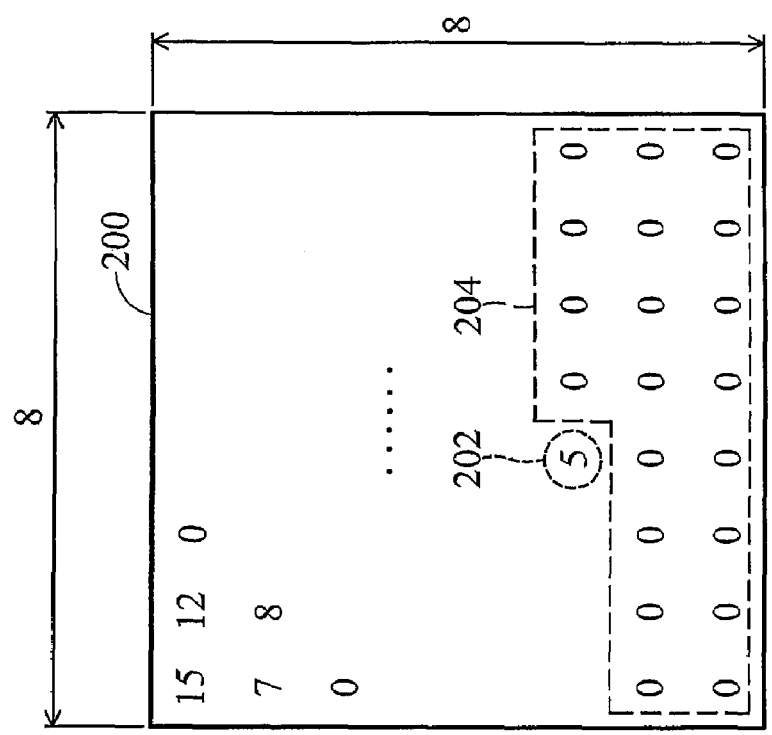
FIG. 2A shows a data block with an EOB code.
Figure 2B:
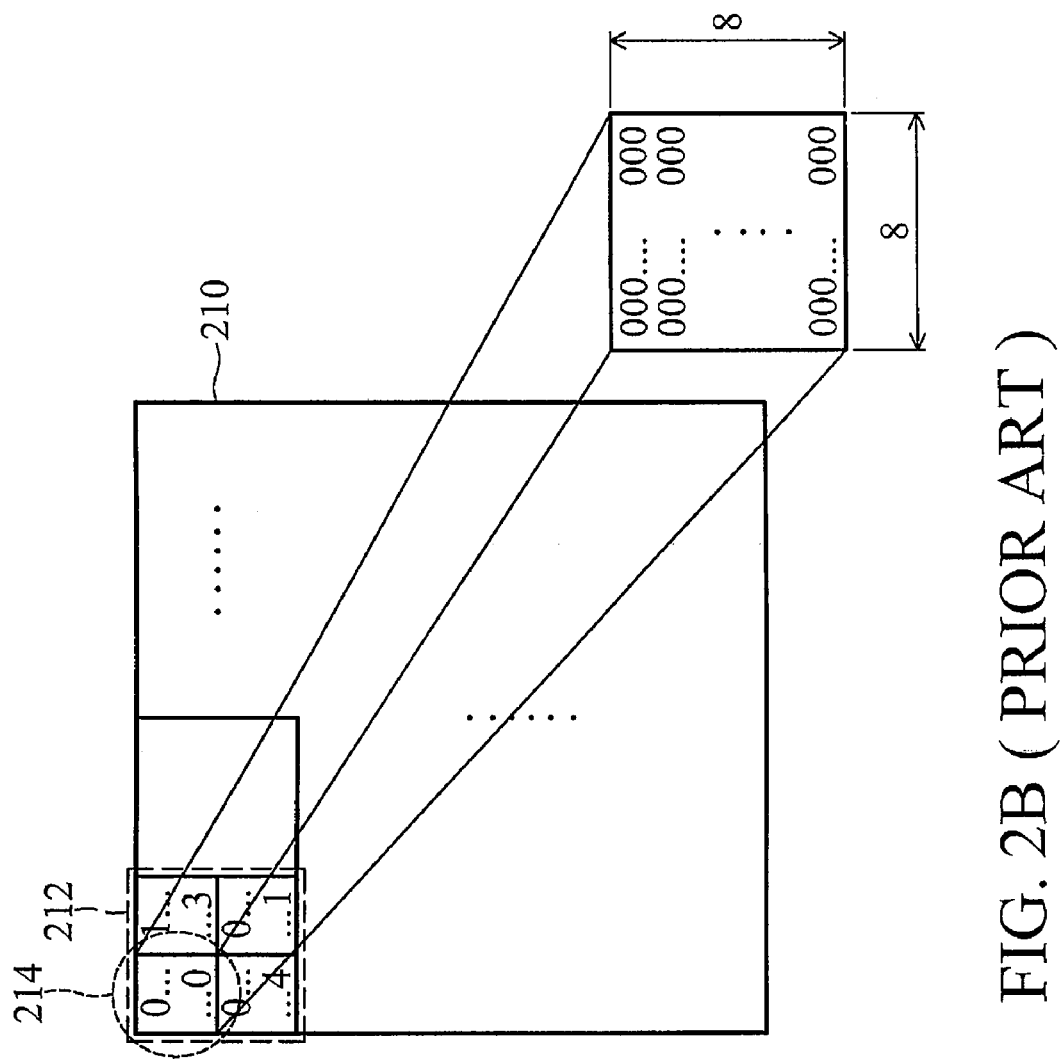
FIG. 2B shows a data block with a CPB bit which value is zero.
Figure 2C:
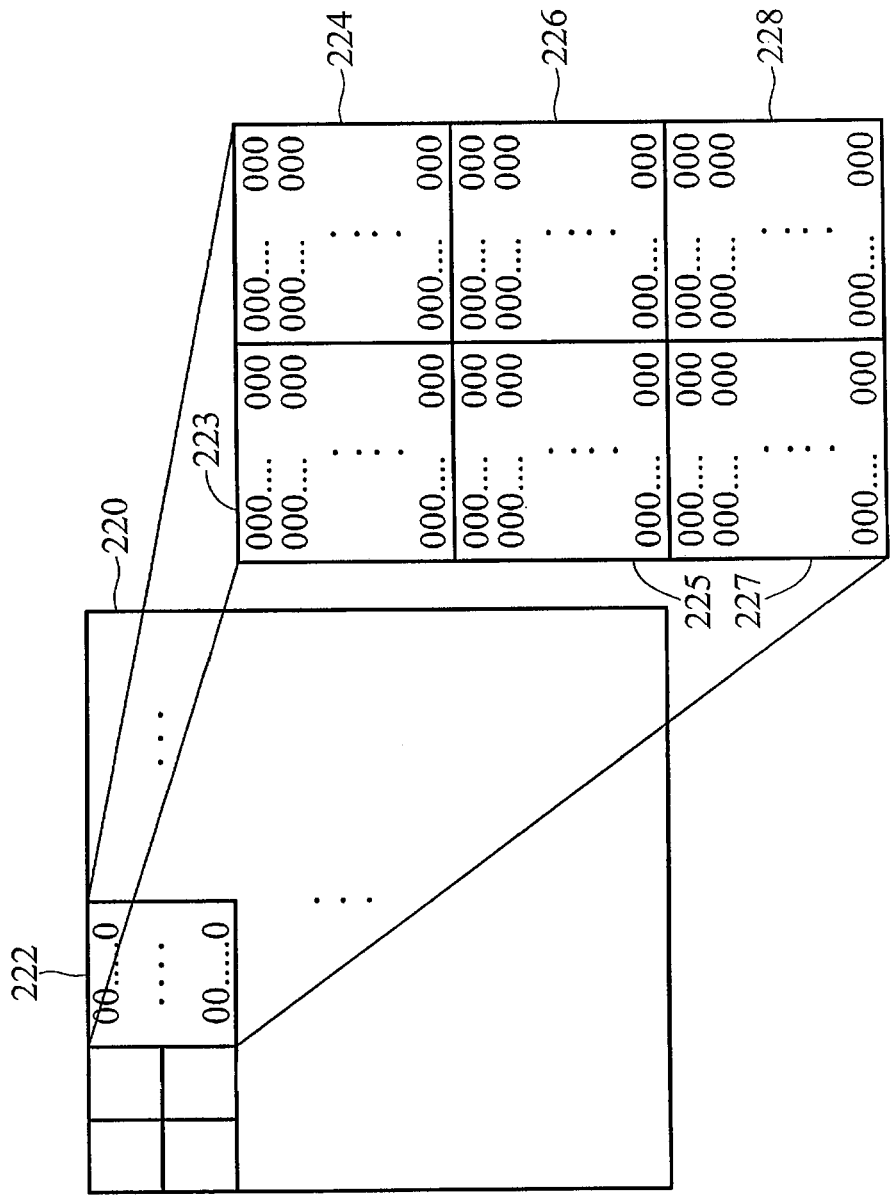
FIG. 2C shows six data blocks corresponding to a skipped macro block data.
Figure 2D:
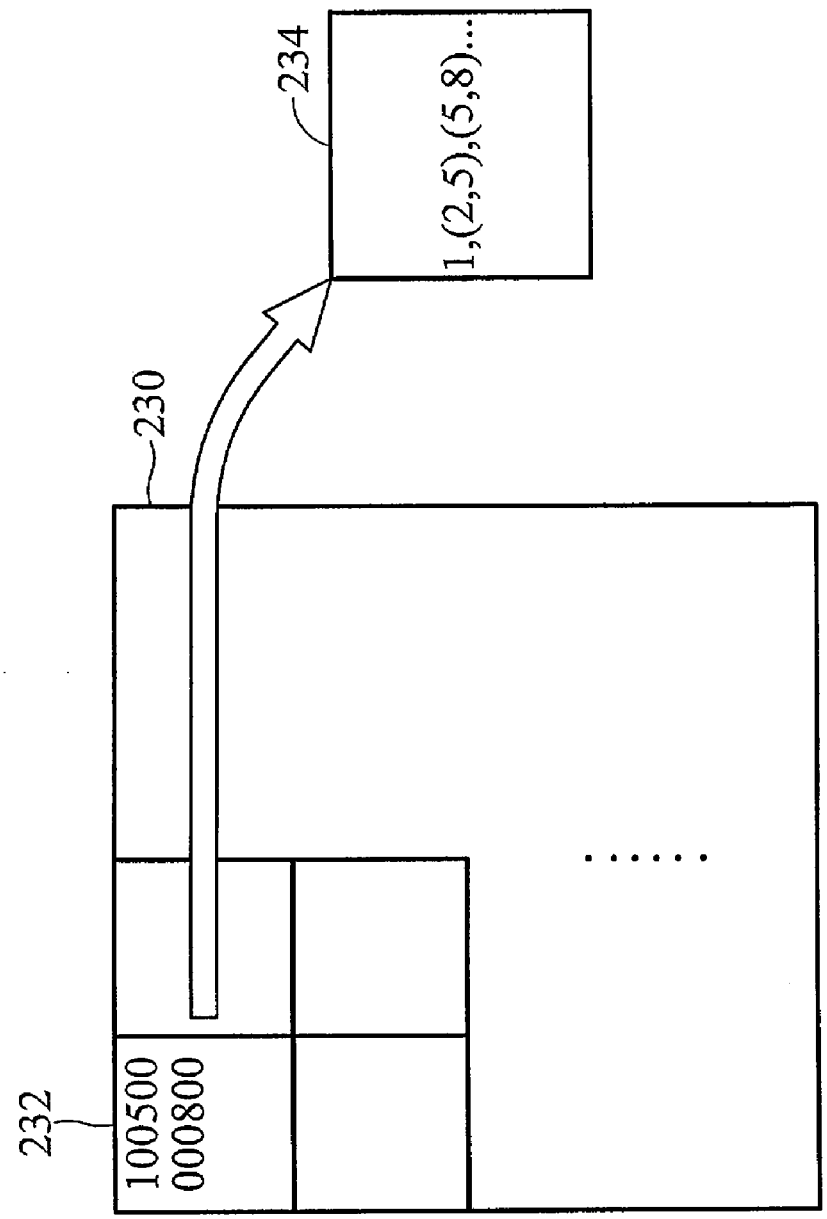
FIG. 2D shows a data block coded as a serial of run-level pairs through a VLC technique.
Figure 5D:
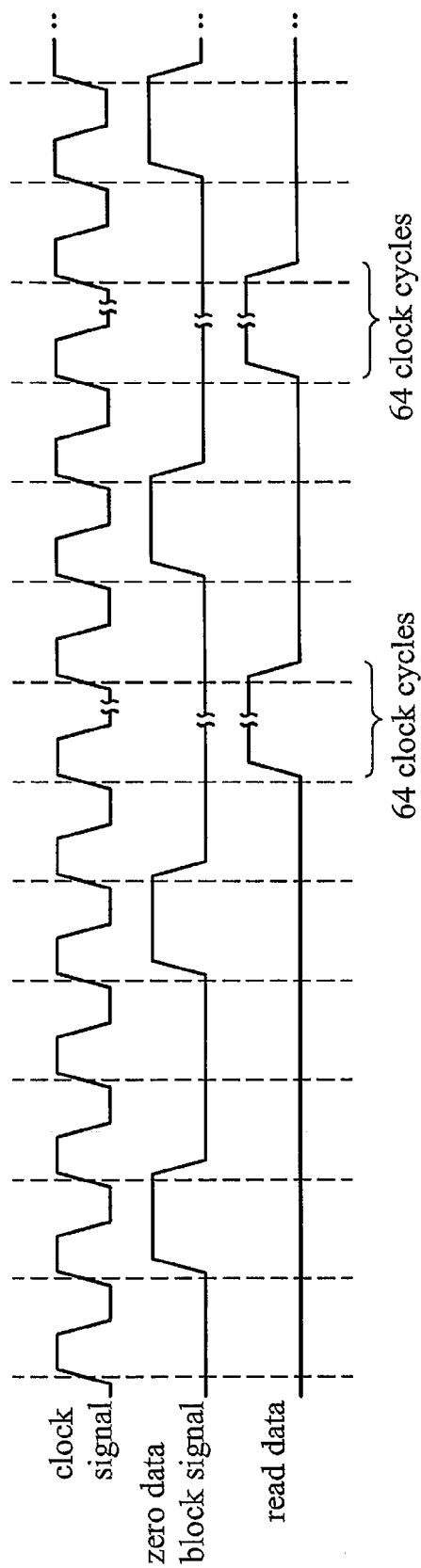
FIG. 5D shows a timing diagram of the zero data block signal corresponding to the skipped macro block data.

In addition, the VLD module 502 also reads a skipped macro block data of the received coded data. As shown in FIG. 2C, the skipped macro block data represents six block data with all zero data values. Thus, the VLD module 502 will sequentially send six zero data block signals to the buffering module 504, wherein a number of sending times of the zero data block signal is counted by a counting module 510. FIG. 5D shows a timing diagram of the zero data block signal corresponding to the skipped macro block data. If the buffering module 504 receives the six zero data block signals sequentially, the inverse quantization module reads six corresponding decoded data block and the buffering module 504 outputs six data blocks which values are zero to the inverse quantization module as a corresponding decoded data. Thus, the VLD module 502 saves 378 (i.e. 64×4−6) clock cycles of sending the zero data block signal to perform other decoding processes.

FIG. 6 shows a VLD module decoding a run-level pair as a decoded data. If the VLD module decodes the run-level pair of the coded data, the VLD module needs to output a plurality of zero values corresponding to the run-level pair continuously due to the one run-level pair comprising a run value and a level value. However, the VLD module does not need to write the zero values into the buffering module again because the buffering module will perform an automatic clearing process in advance. If the level value of the run-level pair is written, a write address of the buffering module is jumped by the VLD module to cross a storage area corresponding to the run value of the run-level pair, and then the level value of the run-level pair is directly written into the buffering module. Specifically, a write address of the level value of the run-level pair is a current write address plus the run value of the run-level pair and one (current write address+run value+1). For example, in FIG. 6, the run values of the run-level pair corresponding to clock 2 and 5 are 3 and 2, and the level values of the run-level pair corresponding to clock 2 and 5 are 12 and 7, respectively. Thus, an address corresponding to the writing level value 12 is 5 (i.e. 1+3+1), and an address corresponding to the writing level value 7 is 10 (i.e. 7+2+1). Therefore, the VLD module saves the clock cycles corresponding to the run value of the run-level pair.

Figure 7:
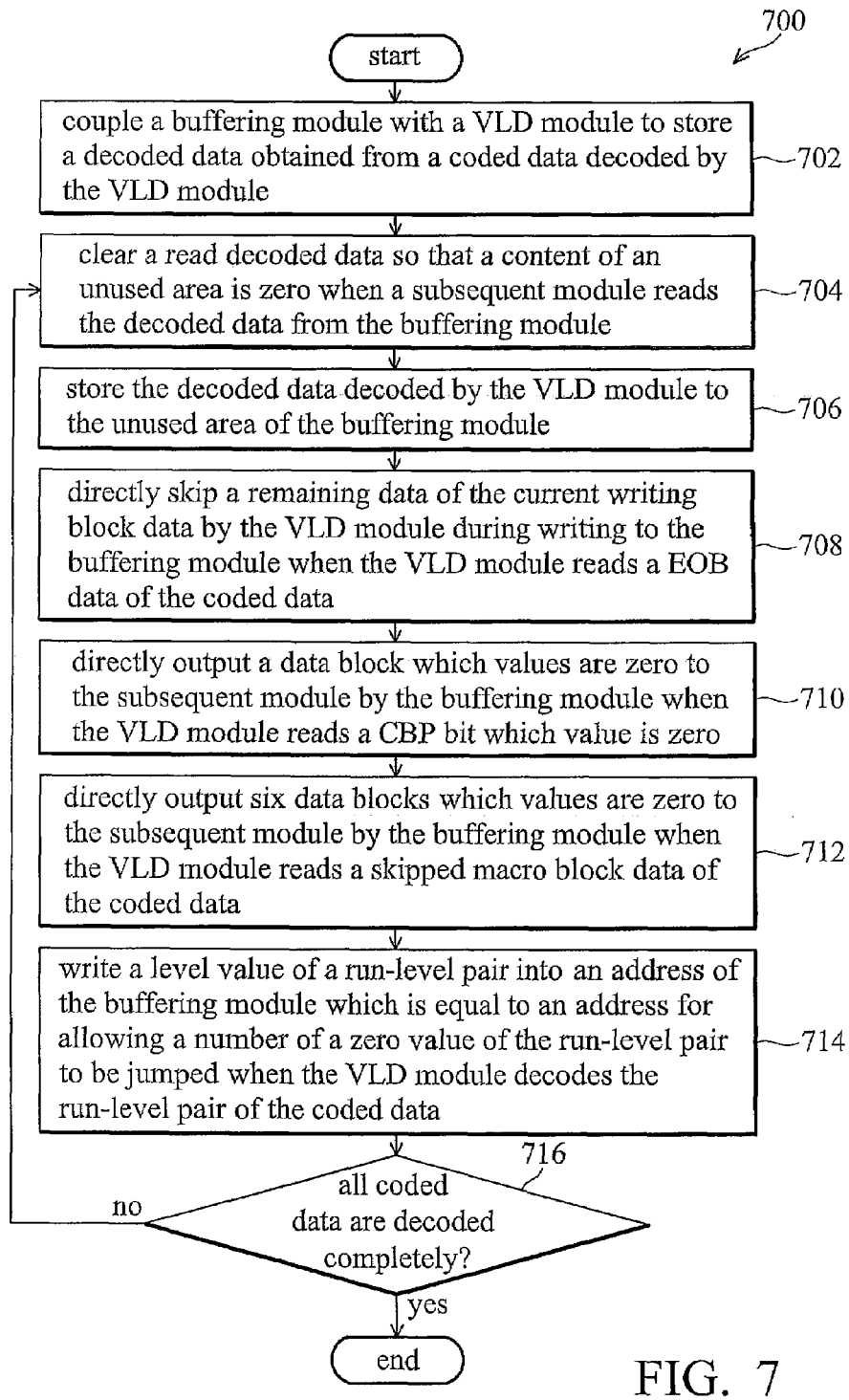
FIG. 7 shows a flow chart of a method for improving VLD performance according to an embodiment of the invention.

FIG. 7 shows a flow chart of a method 700 for improving VLD performance according to an embodiment of the invention. First, in step 702, a buffering module is coupled to a VLD module to store a decoded data obtained from a coded data decoded by the VLD module. Next, in step 704, if a subsequent module (ex. an inverse quantization module) reads the decoded data from the buffering module, the read decoded data is cleared so that a content of an unused area is zero, as shown in FIGS. 4A-4D. Next, in step 706, the decoded data decoded by the VLD module is stored to the unused area of the buffering module. Next, a zero output instruction may be an EOB data, a CPB bit which value is zero, or a skipped macro block data and a run-level pair, according to which type is required by the zero output instructions of the coded data read by the VLD module. The VLD module does not need to write zero values of the decoded data into the buffering module when the VLD module reads above zero output instructions among the coded data. Various processes of above zero output instruction are described below.

In step 708, the VLD module skips the remaining data of the current writing block data and does not write the remaining data into the buffering module when the VLD module reads the EOB data of the coded data, as shown in FIG. 5B. Next, in step 710, the buffering module directly outputs a data block which values are zero to the subsequent module when the VLD module reads that the CBP bit of the coded data is zero, as shown in FIG. 5C. Next, in step 712, the buffering module directly outputs six data blocks which values are zero to the subsequent module when the VLD module reads the skipped macro block data of the coded data, as shown in FIG. 5D. Finally, if the VLD module decodes the run-level pair of the coded data, a level value of the run-level pair is written into an address of the buffering module, which is equal to an address for allowing a number of the zero value of the run-level pair to be jumped, as shown in FIG. 6. These steps can be performed repeatedly until all coded data are decoded completely.

For the above FIG. 7 step descriptions, the steps may be performed in parallel. For example, steps 708, 710, 712 and 714 are selected according to which type is required by the zero output instructions and not step sequence.

A method for improving VLD performance is provided. A buffering module with automatic clearing process is used to save an outputting time when a VLD module is required to output zero values repeatedly. Statistically, the output zero values from 4 continuous outputting zero statuses account for 68.7%-97.4% of the decoded data output by the general VLD module, wherein the 4 continuous outputting zero statuses only comprise the following statuses: 1) a read EOB data; 2) a zero CPB bit; 3) a read skipped macro block data; and 4) a jumped run value of a run-level pair. Therefore, the invention may save 68.7%-97.4% of the processing time of the VLD module, and total performances of the decoding process are enhanced.

While the invention has been described by way of example and in terms of preferred embodiment, it is to be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. A method for improving variable length decoding performance, wherein a variable length decoding module decodes a coded data to obtain a decoded data and a subsequent module receives the decoded data to perform further processing, and the method comprising:

coupling a buffering module between the variable length decoding module and the subsequent module, and buffering the decoded data decoded by the variable length decoding module, wherein the buffering module comprises a first memory and a second memory, and each capacity of the first memory and the second memory is exactly sufficient to store a data block of the decoded data; and clearing a read part of the buffering module so that a content of an unused area of the buffering module is a predetermined value when the subsequent module reads the decoded data from the buffering module, wherein the unused area is a part of the buffering module except for the unread decoded data, wherein the variable length decoding module does not write zero values of the decoded data into the buffering module when the variable length decoding module reads a zero output instruction among the coded data.

2. The method as claimed in claim 1, wherein clearing the read part of the buffering module comprises:

delaying a read signal for reading the decoded data from the buffering module by the subsequent module to generate a clear signal;

delaying a read address for reading the decoded data from the buffering module by the subsequent module to generate a clear address; and writing the predetermined value into the buffering module according to the clear signal, and assigning the clear address as a write address of the buffering module for writing the predetermined value.

3. The method as claimed in claim 1 wherein buffering the decoded data comprises:

writing a plurality of data blocks of the decoded data decoded by the variable length decoding module into the first memory and the second memory in an interchange sequence;

reading a data block of the decoded data from the first memory by the subsequent module when the second memory is written by the variable length decoding module; and reading a data block of the decoded data from the second memory by the subsequent module when the first memory is written by the variable length decoding module.

4. The method as claimed in claim 1, wherein if the zero output instruction indicates that the coded data read by the variable length decoding module is a run-level pair, the variable length decoding module does not decode a run value of the run-level pair to write into the buffering module, and the variable length decoding module writes a level value of the run-level pair into a write address of the buffering module, which is equal to an address for allowing a storage area corresponding to the zero value of the run-level pair to be jumped.

5. The method as claimed in claim 1, wherein if the zero output instruction is an end of block data, the variable length decoding module skips a remaining data of the current writing block data during writing to the buffering module, and the buffering module directly replaces the remaining data of the current writing block data with the predetermined value to output to the subsequent module.

6. The method as claimed in claim 1, wherein if the zero output instruction is a coded block pattern bit which comprises a zero bit, the variable length decoding module skips a data block corresponding to the zero bit during writing to the buffering module, and the buffering module directly outputs the predetermined value of the data block to the subsequent module as the corresponding decoded data.

7. The method as claimed in claim 1, wherein if the zero output instruction is a skipped macro block data, the variable length decoding module skips a macro block corresponding to the skipped macro block data during writing to the buffering module, and the buffering module directly outputs the predetermined value of the macro block to the subsequent module as the corresponding decoded data.

8. The method as claimed in claim 7, wherein the macro block comprises six data blocks.

9. The method as claimed in claim 1, wherein the subsequent module is an inverse quantization module, and the predetermined value is a zero value.

10. A variable length decoding device, comprising:

a variable length decoding module for decoding a coded data coded by a variable length coding technique to obtain a decoded data;

a subsequent module; and a buffering module coupled between the variable length decoding module and the subsequent module, buffering the decoded data from the variable length decoding module, and clearing a read part so that a content of an unused area of the buffering module is a predetermined value when he subsequent module reads the decoded data from the buffering module to perform further processing, wherein the unused area is a part of the buffering module except for the unread decoded data, wherein the buffering module comprises a first memory and a second memory, and each capacity of the first memory and the second memory is exactly sufficient to store a data block of the decoded data, wherein the variable length decoding module does not write zero values of the decoded data into the buffering module when the variable length decoding module reads a zero output instruction among the coded data.

11. The variable length decoding device as claimed in claim 10, wherein a read signal for reading the decoded data from the buffering module by the subsequent module is delayed to generate a clear signal, and a read address for reading the decoded data from the buffering module by the subsequent module is delayed to generate a clear address, and the buffering module automatically writes the predetermined value into the clear address of the buffering module to clear the read part of the buffering module when receiving the clear signal.

12. The variable length decoding device as claimed in claim 10, wherein the variable length decoding module writes a plurality of data blocks of the decoded data into the first memory and the second memory in an interchange sequence, and the subsequent module reads the data block of the decoded data from the first memory when the second memory is written by the variable length decoding module, and the subsequent module reads the data block of the decoded data from the second memory when the first memory is written by the variable length decoding module.

13. The variable length decoding device as claimed in claim 10, wherein if the zero output instruction indicates that the coded data read by the variable length decoding module is a run-level pair, the variable length decoding module does not decode a run value of the run-level pair to write into the buffering module, and the variable length decoding module writes a level value of the run-level pair into a write address of the buffering module, which is equal to an address for allowing a storage area corresponding to the zero value of the run-level pair to be jumped.

14. The variable length decoding device as claimed in claim 10, wherein if the zero output instruction is an end of block data, the variable length decoding module skips a remaining data of the current writing block data during writing to the buffering module, and the buffering module directly replaces the remaining data of the current writing block data with the predetermined value to output to the subsequent module.

15. The variable length decoding device as claimed in claim 10, wherein if the zero output instruction is a coded block pattern bit which comprises a zero bit, the variable length decoding module skips a data block corresponding to the zero bit during writing to the buffering module, and the buffering module directly outputs the predetermined value of the data block to the subsequent module as the corresponding decoded data.

16. The variable length decoding device as claimed in claim 10, wherein if the zero output instruction is a skipped macro block data, the variable length decoding module skips a macro block corresponding to the skipped macro block data during writing to the buffering module, and the buffering module directly outputs the predetermined value of the macro block to the subsequent module as the corresponding decoded data.

17. The variable length decoding device as claimed in claim 16, wherein the macro block comprises six data blocks.

18. The variable length decoding device as claimed in claim 10, wherein the subsequent module is an inverse quantization module, and the predetermined value is a zero value.

\* \* \* \* \*